US012563670B2

(12) United States Patent
 Olsson

(10) Patent No.: US 12,563,670 B2
(45) Date of Patent: Feb. 24, 2026

(54) POWER CONVERTER DEVICE AND A SYSTEM COMPRISING THE SAME

(71) Applicant: Epinovatech AB, Lund (SE)

(72) Inventor: Martin Andreas Olsson, Lund (SE)

(73) Assignee: Epinovatech AB, Lund (SE)

( * ) Notice: Subject to any disclaimer, the term of this patent is extended or adjusted under 35 U.S.C. 154(b) by 138 days.

(21) Appl. No.: 18/560,299

(22) PCT Filed: May 5, 2022

(86) PCT No.: PCT/EP2022/062158
 § 371 (c)(1),
 (2) Date: Nov. 10, 2023

(87) PCT Pub. No.: WO2022/238231
 PCT Pub. Date: Nov. 17, 2022

(65) Prior Publication Data
 US 2024/0235412 A1  Jul. 11, 2024

(30) Foreign Application Priority Data

May 10, 2021 (EP) .................................... 21172959

(51) Int. Cl.
 *H05K 1/14* (2006.01)
 *H02M 7/00* (2006.01)
 (Continued)

(52) U.S. Cl.
 CPC ............ *H05K 1/144* (2013.01); *H02M 7/003* (2013.01); *H02M 7/219* (2013.01); *H02M 7/23* (2013.01);
 (Continued)

(58) Field of Classification Search
 CPC ........ H02M 7/003; H02M 7/23; H05K 1/144; H05K 2201/09209; H05K 2201/2036
 See application file for complete search history.

(56) References Cited

U.S. PATENT DOCUMENTS

| 2,463,073 A | 3/1949 | Webb |
| 4,103,325 A | 7/1978 | Hyman et al. |
| (Continued) | | |

FOREIGN PATENT DOCUMENTS

| CA | 2024133 | 8/1994 |
| CN | 1599099 | 3/2005 |
| (Continued) | | |

OTHER PUBLICATIONS

International Search Report and Written Opinion of PCT/EP2022/062158, dated Aug. 9, 2022 in 12 pages.
(Continued)

*Primary Examiner* — Jue Zhang
(74) *Attorney, Agent, or Firm* — Knobbe, Martens, Olson & Bear, LLP

(57) ABSTRACT
A power converter device is presented. The power converter has two circuit boards. A first circuit board has a first driver and at least four GaN HEMT devices arranged in pairs. A second circuit board having a second driver and at least four MOSFET devices arranged in pairs. There are at least two electrical connections between the two circuit boards. The first and second circuit boards are arranged one above the other such that they extend in parallel and the electrical connections between the two circuit boards extend in a direction substantially perpendicular to the circuit boards. The at least four GaN HEMT devices are electrically connected equidistant to the first driver.

15 Claims, 5 Drawing Sheets

(51) Int. Cl.
    *H02M 7/219*     (2006.01)
    *H02M 7/23*     (2006.01)

(52) U.S. Cl.
    CPC .............. *H05K 2201/09209* (2013.01); *H05K 2201/2036* (2013.01)

(56) References Cited

U.S. PATENT DOCUMENTS

| | | | |
|---|---|---|---|
| 4,873,497 A | 10/1989 | Kielmeyer | |
| 5,362,972 A | 11/1994 | Yazawa et al. | |
| 5,976,957 A | 11/1999 | Westwater et al. | |
| 6,306,734 B1 | 10/2001 | Givargizov | |
| 6,734,451 B2 | 5/2004 | Eriguchi et al. | |
| 6,861,271 B2 | 3/2005 | Chua et al. | |
| 7,250,359 B2 | 7/2007 | Fitzgerald | |
| 7,432,522 B2 | 10/2008 | Samuelson et al. | |
| 7,829,362 B2 | 11/2010 | Fukutani et al. | |
| 8,094,223 B1 | 1/2012 | De Wit et al. | |
| 8,324,660 B2 | 12/2012 | Lochtefeld et al. | |
| 8,334,157 B2 | 12/2012 | Smeeton et al. | |
| 8,344,242 B2 | 1/2013 | Fiorenza et al. | |
| 8,835,905 B2 | 9/2014 | Wober et al. | |
| 9,000,353 B2 | 4/2015 | Seo et al. | |
| 9,275,857 B1 | 3/2016 | Hersee | |
| 9,379,204 B2 | 6/2016 | Fogel et al. | |
| 9,406,709 B2 | 8/2016 | Seo et al. | |
| 9,764,950 B2 | 9/2017 | Colinge et al. | |
| 9,887,637 B1 | 2/2018 | Shah et al. | |
| 9,979,326 B1 | 5/2018 | Zanelato et al. | |
| 9,984,872 B2 | 5/2018 | Park et al. | |
| 10,263,149 B2 | 4/2019 | Samuelson et al. | |
| 10,387,792 B1 | 8/2019 | Ladd et al. | |
| 10,439,671 B2 | 10/2019 | Kamgaing et al. | |
| 10,742,208 B1 | 8/2020 | Moyer et al. | |
| 11,316,165 B2 | 4/2022 | Olsson | |
| 11,469,300 B2 | 10/2022 | Olsson | |
| 11,634,824 B2 | 4/2023 | Olsson | |
| 11,652,454 B2 | 5/2023 | Olsson | |
| 11,695,066 B2 | 7/2023 | Olsson | |
| 11,955,972 B2 | 4/2024 | Olsson | |
| 12,009,431 B2 | 6/2024 | Olsson | |
| 12,027,989 B2 | 7/2024 | Olsson | |
| 12,068,726 B2 | 8/2024 | Olsson | |
| 12,148,821 B2 | 11/2024 | Olsson | |
| 12,355,442 B2 | 7/2025 | Olsson | |
| 12,382,656 B2 | 8/2025 | Olsson | |
| 2001/0050220 A1 | 12/2001 | Chiang et al. | |
| 2003/0022395 A1 | 1/2003 | Olds | |
| 2003/0089930 A1 | 5/2003 | Zhao | |
| 2003/0165418 A1 | 9/2003 | Ajayan | |
| 2005/0064291 A1 | 3/2005 | Sato et al. | |
| 2005/0159000 A1 | 7/2005 | Ohno et al. | |
| 2005/0189566 A1 | 9/2005 | Matsumoto et al. | |
| 2006/0060866 A1 | 3/2006 | Tezen | |
| 2006/0134883 A1 | 6/2006 | Hantschel | |
| 2006/0189018 A1 | 8/2006 | Yi | |
| 2006/0216815 A1 | 9/2006 | Cheng et al. | |
| 2007/0108435 A1 | 5/2007 | Harmon | |
| 2007/0197396 A1 | 8/2007 | Holcomb | |
| 2007/0215899 A1 | 9/2007 | Thomas | |
| 2007/0277866 A1 | 12/2007 | Sander et al. | |
| 2007/0295993 A1 | 12/2007 | Chen et al. | |
| 2008/0001169 A1 | 1/2008 | Lochtefeld | |
| 2008/0122418 A1 | 5/2008 | Biere et al. | |
| 2008/0153000 A1 | 6/2008 | Salot et al. | |
| 2008/0171424 A1 | 7/2008 | Li | |
| 2009/0269909 A1 | 10/2009 | Kim | |
| 2010/0097027 A1 | 4/2010 | Jackson | |
| 2010/0176459 A1 | 7/2010 | Wernersson et al. | |
| 2010/0259186 A1 | 10/2010 | Ernoux | |
| 2010/0276664 A1 | 11/2010 | Hersee | |
| 2010/0276665 A1 | 11/2010 | Wang | |
| 2010/0314617 A1 | 12/2010 | Ito | |
| 2011/0020704 A1 | 1/2011 | Fukuchi | |
| 2011/0036396 A1 | 2/2011 | Jayaraman | |
| 2011/0140072 A1 | 6/2011 | Varangis | |
| 2011/0143472 A1 | 6/2011 | Seifert | |
| 2011/0169012 A1 | 7/2011 | Hersee et al. | |
| 2011/0204381 A1 | 8/2011 | Okada et al. | |
| 2011/0233575 A1 | 9/2011 | Huang et al. | |
| 2011/0253187 A1 | 10/2011 | Ohta et al. | |
| 2011/0305950 A1 | 12/2011 | Kuriki et al. | |
| 2012/0001153 A1 | 1/2012 | Hersee | |
| 2012/0052560 A1 | 3/2012 | Knight et al. | |
| 2012/0235117 A1 | 9/2012 | Takashi et al. | |
| 2012/0292592 A1 | 11/2012 | Hwang et al. | |
| 2013/0061747 A1 | 3/2013 | Turnbull et al. | |
| 2013/0126907 A1 | 5/2013 | Kitano et al. | |
| 2013/0175501 A1 | 7/2013 | Hersee | |
| 2013/0187627 A1 | 7/2013 | Imada et al. | |
| 2013/0292683 A1 | 11/2013 | Shah | |
| 2014/0008609 A1 | 1/2014 | Chiu | |
| 2014/0078781 A1 | 3/2014 | Imada | |
| 2014/0134773 A1 | 5/2014 | Rakesh et al. | |
| 2014/0183446 A1 | 7/2014 | Nago et al. | |
| 2014/0197130 A1 | 7/2014 | Lemke | |
| 2014/0231870 A1 | 8/2014 | Hoke | |
| 2014/0239346 A1 | 8/2014 | Green et al. | |
| 2015/0014631 A1 | 1/2015 | Ohlsson | |
| 2015/0060996 A1 | 3/2015 | Colinge | |
| 2015/0076450 A1 | 3/2015 | Weman | |
| 2015/0084685 A1 | 3/2015 | Hirose et al. | |
| 2015/0118572 A1 | 4/2015 | Lund et al. | |
| 2015/0155275 A1 | 6/2015 | Bahramian et al. | |
| 2015/0171784 A1 | 6/2015 | Lipo et al. | |
| 2015/0236134 A1 | 8/2015 | Zhong et al. | |
| 2015/0263100 A1 | 9/2015 | Deboy | |
| 2015/0311072 A1 | 10/2015 | Aagesen | |
| 2015/0318448 A1 | 11/2015 | Nan et al. | |
| 2015/0333216 A1 | 11/2015 | Pourquire | |
| 2016/0172305 A1 | 6/2016 | Sato | |
| 2016/0203972 A1 | 7/2016 | Sundaram et al. | |
| 2016/0211789 A1 | 7/2016 | Hanft et al. | |
| 2016/0276433 A1 | 9/2016 | Holland | |
| 2017/0002471 A1 | 1/2017 | Okamoto | |
| 2017/0062213 A1 | 3/2017 | Patolsky | |
| 2017/0110332 A1 | 4/2017 | Beveridge | |
| 2017/0125574 A1 | 5/2017 | Chowdhury et al. | |
| 2017/0178971 A1 | 6/2017 | Merckling et al. | |
| 2017/0200820 A1 | 7/2017 | Conway et al. | |
| 2017/0229569 A1 | 8/2017 | Chowdhury et al. | |
| 2017/0257025 A1 | 9/2017 | Meiser | |
| 2017/0309736 A1 | 10/2017 | Huang et al. | |
| 2017/0323788 A1 | 11/2017 | Mi | |
| 2017/0338277 A1 | 11/2017 | Banna et al. | |
| 2018/0033889 A1 | 2/2018 | Yang et al. | |
| 2018/0229618 A1 | 8/2018 | Lee et al. | |
| 2018/0240797 A1 | 8/2018 | Yokoyama et al. | |
| 2018/0316383 A1 | 11/2018 | Kamgaing et al. | |
| 2019/0013404 A1 | 1/2019 | Carlson et al. | |
| 2019/0081164 A1 | 3/2019 | Shrivastava | |
| 2019/0088820 A1 | 3/2019 | Danesh et al. | |
| 2019/0149031 A1 | 5/2019 | Kitamoto | |
| 2019/0165182 A1 | 5/2019 | Van Dal | |
| 2019/0189746 A1 | 6/2019 | Makiyama et al. | |
| 2019/0214529 A1 | 7/2019 | Ahmed | |
| 2019/0229149 A1 | 7/2019 | Yoo | |
| 2019/0252377 A1 | 8/2019 | Clarke et al. | |
| 2019/0267484 A1 | 8/2019 | Takahashi et al. | |
| 2019/0284706 A1 | 9/2019 | Takeda et al. | |
| 2019/0356278 A1 | 11/2019 | Smith | |
| 2019/0363069 A1 | 11/2019 | Ahmed et al. | |
| 2019/0393104 A1 | 12/2019 | Ando | |
| 2020/0027972 A1 | 1/2020 | Petta et al. | |
| 2020/0127173 A1 | 4/2020 | Park et al. | |
| 2020/0161531 A1 | 5/2020 | Olivadese et al. | |
| 2020/0185219 A1 | 6/2020 | Busani et al. | |
| 2020/0185386 A1 | 6/2020 | Yamazaki et al. | |
| 2020/0194416 A1 | 6/2020 | Or-Bach et al. | |
| 2020/0203556 A1 | 6/2020 | Feuillet et al. | |
| 2020/0256710 A1 | 8/2020 | Rule et al. | |
| 2020/0381538 A1 | 12/2020 | Shih et al. | |
| 2020/0388723 A1 | 12/2020 | Ahmed et al. | |
| 2021/0057601 A1 | 2/2021 | Oliver et al. | |

(56) References Cited

U.S. PATENT DOCUMENTS

| | | | |
|---|---|---|---|
| 2021/0233998 A1 | 7/2021 | Tomida | |
| 2021/0265632 A1 | 8/2021 | Olsson | |
| 2021/0288539 A1 | 9/2021 | Abdel-Khalik et al. | |
| 2021/0327712 A1 | 10/2021 | Olsson | |
| 2022/0119936 A1 | 4/2022 | Hong et al. | |
| 2022/0122815 A1 | 4/2022 | Lariviere et al. | |
| 2022/0231298 A1 | 7/2022 | Olsson | |
| 2022/0302293 A1 | 9/2022 | Olsson | |
| 2022/0376096 A1 | 11/2022 | Wu | |
| 2022/0393656 A1 | 12/2022 | Olsson | |
| 2022/0396886 A1 | 12/2022 | Olsson | |
| 2022/0399826 A1 | 12/2022 | Olsson | |
| 2022/0416025 A1 | 12/2022 | Olsson | |
| 2023/0119801 A1 | 4/2023 | Olsson | |
| 2023/0146820 A1 | 5/2023 | Olsson | |
| 2023/0261621 A1 | 8/2023 | Olsson | |
| 2023/0327009 A1 | 10/2023 | Olsson | |
| 2023/0352575 A1 | 11/2023 | Olsson | |
| 2024/0186365 A1 | 6/2024 | Olsson | |
| 2024/0250686 A1 | 7/2024 | Olsson | |
| 2024/0332423 A1 | 10/2024 | Olsson | |
| 2024/0356456 A1 | 10/2024 | Olsson | |
| 2024/0363693 A1 | 10/2024 | Olsson | |
| 2024/0380369 A1 | 11/2024 | Olsson | |
| 2025/0040175 A1 | 1/2025 | Olsson | |
| 2025/0063732 A1 | 2/2025 | Olsson | |
| 2025/0081501 A1 | 3/2025 | Olsson | |
| 2025/0158070 A1 | 5/2025 | Olsson | |
| 2025/0160056 A1 | 5/2025 | Olsson | |
| 2025/0169121 A1 | 5/2025 | Olsson | |
| 2025/0236961 A1 | 7/2025 | Olsson | |
| 2025/0268104 A1 | 8/2025 | Olsson | |

FOREIGN PATENT DOCUMENTS

| | | |
|---|---|---|
| CN | 101621292 | 5/2012 |
| CN | 101765934 | 3/2013 |
| CN | 103477418 | 12/2013 |
| CN | 103681663 | 3/2014 |
| CN | 105659383 | 6/2016 |
| CN | 105914232 | 8/2016 |
| CN | 105990443 | 10/2016 |
| CN | 106549050 | 3/2017 |
| CN | 107768439 | 3/2018 |
| CN | 108701672 | 10/2018 |
| CN | 110324568 | 10/2019 |
| CN | 110336028 | 3/2021 |
| CN | 112490243 | 3/2021 |
| CN | 114651084 | 6/2021 |
| CN | 113224140 | 8/2021 |
| EP | 1959530 | 8/2008 |
| EP | 2075745 | 7/2009 |
| EP | 2571065 | 3/2013 |
| EP | 2816729 | 12/2014 |
| EP | 284700 | 1/2015 |
| EP | 2838125 | 2/2015 |
| EP | 2955763 | 12/2015 |
| EP | 4082037 | 11/2022 |
| GB | 2520687 | 6/2015 |
| JP | H09246471 | 9/1997 |
| JP | 2000101152 | 4/2000 |
| JP | 2003101069 | 4/2003 |
| JP | 2005268555 | 9/2005 |
| JP | 2008057383 | 3/2008 |
| JP | 2009152189 | 7/2009 |
| JP | 2010232423 | 10/2010 |
| JP | 2011529639 | 12/2011 |
| JP | 2012018919 | 1/2012 |
| JP | 2014146744 | 8/2014 |
| JP | 2014217252 | 11/2014 |
| JP | 2015198549 | 11/2015 |
| JP | 2016135000 | 7/2016 |
| JP | 2018050419 | 3/2018 |
| JP | 2019092292 | 6/2019 |
| JP | 2019114581 | 7/2019 |

| | | |
|---|---|---|
| JP | 2020061510 | 4/2020 |
| KR | 10-1997-0042276 | 7/1997 |
| KR | 10-1998-0076226 | 11/1998 |
| KR | 10-2013-0030193 | 3/2013 |
| KR | 10-2019-0015134 | 2/2019 |
| TW | 201036347 | 10/2010 |
| TW | 201418530 | 5/2014 |
| TW | 201538771 | 10/2015 |
| TW | 201709279 | 3/2017 |
| WO | WO 95/08452 | 3/1995 |
| WO | WO 2010/01412 | 1/2010 |
| WO | WO 2010/100599 | 9/2010 |
| WO | WO 2012/077513 | 6/2012 |
| WO | WO 2012/105901 | 8/2012 |
| WO | WO 2013/049817 | 4/2013 |
| WO | WO 2014/008162 | 1/2014 |
| WO | WO 2017/038403 | 3/2017 |
| WO | WO 2017/111844 | 6/2017 |
| WO | WO 2017/213644 | 12/2017 |
| WO | WO 2019/144966 | 8/2019 |
| WO | WO 2019/202258 | 10/2019 |
| WO | WO 2020/222149 | 11/2020 |
| WO | WO 2021/021415 | 2/2021 |

OTHER PUBLICATIONS

Kampl et al., "2500 W full-bridge totem-pole power factor correction using CoolGaN," Nov. 5, 2018, pp. 1-46.

Lu et al., "Paralleling GaN E-HEMTs in 10kW-100kW systems," 2017 IEEE Applied Power Electronics Conference and Exposition, Mar. 26, 2017, pp. 3049-3056.

Zhang et al., "Conducted noise reduction of totem-pole bridgeless PFC converter using GaN HEMTs," 2015 IEEE International Telecommunications Energy Conference, Oct. 18, 2015, pp. 1-5.

Alamo et al., III-V CMOS: the key to sub-10 nm electronics?, Microsystems Technology Laboratories, MIT, 2011 MRS Spring Meeting and Exhibition Symposium P: Interface Engineering for Post-CMOS Emerging Channel Materials.

Anonymous, "High-electron-mobility transistor—Wikipedia", Mar. 6, 2020 (Mar. 6, 2020), XP055808423,Retrieved from the Internet: URL:https://en.wikipedia.org/w/index.php?title=High-electron-mobilitytransistor&old id=944233239, retrieved on May 27, 2021 6 pages.

Anonymous, "Phase-shift oscillator Wikipedia" Apr. 7, 2019 (Apr. 7, 2019), XP055733459, Retrieved from the Internet: URL:https://en.wikipedia.org/w/index.php?title=Phase-shift-oscillator&oldid=89138949 5, retrieved on Sep. 23, 2020 in 3 pages.

Asghar Asgari, "Negative Differential Capacitance of AlGaN/GaN Heterostructure in Presence of InN Quantum Dots", SPIE, PO Box 10 Bellingham WA 98227-0010 USA, Jan. 1, 2008.

Cai et al, Monolithically Integrated Enhancement-and Depletion-Mode AlGaN/GaN HEMT for gaN Digital Integrated Circuits, vol. 53, No. 9, Sep. 1, 2006 (Sep. 1, 2006), pp. 2223-2230.

Chebrolu et al., "Recent progress in quantum dot sensitized solar cells: an inclusive review of photoanode, sensitizer, electrolyte, and the counter electrode", Journal of Materials Chemistry C 2019, pp. 4911-4933.

Dahal et al., "Realizing InGaN monolithic solar-photoelctrochemical cells for artificial photosynthesis", Appl. Phys, Lett. 104, 143901, (2014); Published Onlines: Apr. 9, 2014.

Doring et al., "Technology of GaN-Based Large Area CAVETs With Co-Integrated HEMTs," IEEE Transactions on Electron Devices, vol. 68, No. 11, Nov. 2021, pp. 5547-5552.

Eickhoff et al., "Piezoresistivity of Alx Ga1—xN layers and Alx Ga10xN/GaN heterostructures," Journal of Applied Physics, American Institute of Physics, vol. 90, No. 7, Oct. 1, 2001, pp. 3383-3386.

Enthaler et al., "Carbon dioxide and formic acid-the couple for environmental-friendly hydrogen storage?", Energy & Enviormental Science, 2010 pp. 1207-1217.

Faunce et al., "Nanotechnology, Plasma, Hydrogen from Artificial Photosynthesis, and Fuel Cells: Powering the Developing World to the Sustainocene", Nanotechnology Toward the Sustoinocene, Chapter 11, pp. 241-257.

(56) References Cited

OTHER PUBLICATIONS

Fujii et al., "Photoelectrochemical Properties of Ingan For H2 Generation From Aqueous Water", Japanese Journal of Applied Physics, Japan Society Of Applied Physics, JP, vol. 44, No. 10, Oct. 11, 2005 (Oct. 11, 2005), pp. 7473-7435.

Gust et al., "Solar Fukes via Artificial Photosynthesis", Department of Chemistry and Biochemestry and Center for Bioenergy and Photosynthesis, Arizona State University, Jul. 17, 2009, in 9 pages.

Iqbal et al. "Reactive Sputtering of Aluminum Nitride Thin Files for Piezoeletric Applications: A Review", Sensors, vol. 18, No. 6, Jun. 2018 in 21 pages.

Kozodoy et al. "Polarization-enhanced Mg doping of AlGaN/GaN superlattices," Applied Physics Letters, vol. 75, No. 16, Oct. 18, 1999, pp. 2444-2446.

Krishna et al. "AlGaN/GaN Superlattice-Based p-Type Field-Effect Transistor with Tetramethylammoninum Hydoxide Treatment," Physica Status Solidi, vol. 217, No. 7, Apr. 1, 2020 in 8 pages.

Kumar et al. "Quantum dot activated indium gallium nitride on silicon as photoanode for solar hydrogen generation", Communcations Chemestry, in 7 pages.

Lan et al., "Efficienty improvement of the Light-emitting diodes by the lateral overgrowth GaN on an AIN nanorod template," 14th International Conference on Solid State Lighting and LED-based Illumination Systems 957100 SPIE, Sep. 8, 205 in 7 pages.

Matioli et al. "Room-Temperature Ballistic Transport in III-Nitride Heterostructures," ResearchGate, https://www.researchgate.net/publication/271329249_Room-Temperature_Ballistic_Transport_in_III-Nitride_Heterostructures/link/57d9301d08ae6399a39acce3/download?_tp=eyJjb250ZXh0Ijp7ImZpcnN0UGFnZSI6InB1Ymxp Y2F0aW9uIiwicGFnZSI6InB1YmxpY2F0aW9uln19, Jan. 2015, in 10 pages.

Mitsunari et al., "Single-crystalline semipolar GaN on Si(001) using a directional supttered AIN intermediate layer", Journal of Crystal Growth, 2015 in 4 pages.

Mukhopadhyay, P. "Comparative DC Characteristic Analysis of AlGaN/GaN HEMTs Grown on Si(111) and Sapphire Substrates by MBE" Jour. Of Elec. Mat. vol. 43, No. 4, Feb. 14, 2014 pp. 1263-1270 (Year: 2014).

Myers et al., "Diffusion, release, and uptake of hydrogen in magnesium-doped gallium nitride: Theory and experiment," Journal of Applied Physics, vol. 89, No. 6, Mar. 15, 2001, pp. 3195-3202.

Nabi et al., "Photoluminescence and hydrogen storage properties of gallium nitride hexagonal micro-bricks," ScienceDirect, vol. 79, Jul. 15, 2012, pp. 212-215.

Nainani, "High-Performance III-V PMOSFET", May 2011, in 131 pages.

Naveed ul Hassan Alvi et al., "InN/InGaN Quantum Dot Photoelectrode: Efficient Hydrogen Generation By Water Splitting At Zero Voltage", Nano Energy, vol. 13, Mar. 6, 2015 (Mar. 6, 2015), pp. 291-297.

Park, J. "Comparison of AlGaN/GaN High Electron Mobility Transistor with AIN or GaN as a cap layer" Conference paper proceedings on Research Gate available online at address recited in the Office Action as of Jul. 14, 2015 pp. 1-2 (Year: 2015).

Park et al., "Integrated silicon microring resonator devices for point-of-care diagnostic applications," Proceedings of SPIE, Mar. 8, 2014, vol. 8990, in 8 pages.

Raj et al. "Demonstration of a GaN/AlGaN Superlattice-Based p-Channel FinFET With High ON-current," IEEE Electron Device Letters, vol. 41, No. 2, Dec. 31, 2019, pp. 220-223.

Ramakrishna et al. "Nitrogen doped CNTs supported Palladium electrocatalyst for hydrogen evolution reaction in PEM water electrolyser", International Journal of Hydrogen Energy, 2016 pp. 20447-20454.

Seo et al., "i-based nonalloyed Ohmic contacts for AI0.15Ga0.85N/GaN high electron mobilitytransistors using regrown n+-GaN by plasma assisted molecular beam epitaxy," Applied Physics Letters, vol. 93, Issue 10, Sep. 8, 2008, pp. 102102-102102.

Shibata, D. "1. 7 kV/ 1.0 mQcm2 Normally-off Vertical GaN Transistor on GaN substrate with Regrown p-GaN/AIGaN/GaN SemipolarGate Structure" IEEE Int. Elec. Dev. Meet. IEDM 2016, Feb. 2, 2017 pp. 248-251 (Year: 2016).

Shrestha et al. "Optimal design 5,9 of the multiple-apertures-GaN-based vertical HEMTs with SiO2 current blocking layer", Journal of Computational Electronics, Springer US, Boston, vol. 15, No. 1. Aug. 7, 2015 (Aug. 7, 2015 pp. 154-162.

Sritoma et al., "A Novel GaN-Hemt based Inverter and Cascade Amplifier," 2018 IEEE Electron Devices Kolkata Conference (EDKCON), IEEE, Nov. 24, 2018 (Nov. 24, 2018), pp. 465-469.

Sundaram et al, "Single-crystal nanopyramidal BGaN by nanoselective area growth on AIN/Si(111) and GaN templates"., Nanotechnology, vol. 27 (2016) 7 pages.

Tavares et al., "Implementation of a high frequency PWM signal in FPGA For GaN power devices switching", 2017 Brazilian Power Electronics Conference (COBEP), IEEE, Nov. 19, 2017 (Nov. 19, 2017), pp. 1-7.

Hong et al., "A Model for the Growth of AIN Films on Silicon Substrates by Plasma-Assisted Molecular Beam Epitaxy," Electrochemical and Solid-State Letters, vol. 5, No. 7, May 2, 2002, pp. G54.

Iqbal et al. "Sputtering of aluminium nitride (002) film on cubic silicon carbide on silicon (100) substrate: influences of substrate temperature and deposition power," Journal of Materials Science: Materials in Electronics, vol. 31, Dec. 5, 2019, pp. 239-248.

POWER CONVERTER DEVICE AND A SYSTEM COMPRISING THE SAME

TECHNICAL FIELD

The present disclosure relates to a power converter device, and especially to a power converter device comprising GaN HEMT devices.

BACKGROUND

Silicon MOSFETs are normally-off devices i.e. at a certain positive threshold voltage they conduct. Gallium nitride (GaN) high-electron-mobility transistor (HEMT) devices are typically normally on, but can be made normally off. Superior properties of GaN HEMT devices are their low ON-resistance, Rds(on) with lower values than silicon MOSFETs giving rise to lower conduction losses. GaN HEMT devices typically have a negative threshold voltage i.e. it is normally-on at zero gate voltage. If the transistor is in the ON-state and the power is turned on, a short-circuit may arise. GaN HEMT devices have lower switching losses and lower conduction losses than silicon, but due to their normally-on behavior (unless specifically made enhancement mode GaN HEMTs), they are prone to short-circuit in power electronics application. Such short-circuit is devastating in power electronics, but less of an issue in e.g. RF application at low voltage.

GaN devices can be driven at much higher working frequencies such as 1 MHz for power electronics applications compared to silicon MOSFETs that typically have a working frequency of ~100 Hz. However, a frequency above ~66 Hz introduces a second harmonic that causes issues with electromagnetic compatibility (EMC). Even though this may be filtered with a large LC filter, such a filter is impractical as it becomes bulky and defeats the purpose of using GaN, as GaN may decrease the system size with smaller passive components.

In addition, the switching times of GaN HEMTs are much faster than silicon MOSFETs and causes electromagnetic radiation. Fast switching times is desirable as well as low input and output capacitance. Compared to silicon MOSFETs, GaN HEMT devices have different reverse current characteristics (i.e. third quadrant conduction in an ID vs. VGS graph). It is required that while the GaN HEMT is in the OFF-state that it can conduct the reverse current while another GaN HEMT of a half-bridge is in the ON-state in a typical half-bridge configuration. Reverse current conduction can typically be handled by the body diode of a silicon MOSFET.

Furthermore, GaN HEMT devices are typically limited to voltages lower than that of silicon carbide i.e. less than 1200V. Therefore, silicon carbide MOSFETs have been the preferred choice of transistor for high power and high voltage applications. However, for AC-DC conversion GaN is about 30% more energy-efficient than silicon carbide why there has been an interest in the application of GaN in high power electronics.

GaN transistor devices may be used in power electronics as cascode devices or enhancement mode HEMT devices. The cascode consists of a HEMT integrated with a silicon MOSFET that drives the HEMT. The HEMT device is normally-on and the integrated MOSFET controls the HEMT to behave as if it was normally-off but is normally-on.

So far, the application of GaN devices, even though they have shown promise for high power application, have been limited to mid power, about 4 kW. In order to reach higher power, parallel GaN devices may be required. However, paralleling many transistors may cause a voltage drop over a transistor ladder. This voltage drop is large enough to cause a single device to heat up more, such that the ON-resistance increases, and one or more devices may burn causing failure of the electronics. Due to the extremely fast switching times of GaN HEMT devices, any two GaN HEMT devices may receive different amount of current which can lead to failure of the devices. This is because each individual transistor is not identical to the other transistors.

One solution for cascode GaN devices is the use of ferrites that behave as inductors at the working frequency that slows down the switching speed of the cascode devices to ensure proper current sharing when GaN devices operate in parallel.

Using enhancement mode (e-mode) GaN HEMT devices provides that the devices instead operate as normally-off. The normally-off operation may be configured by a pGaN gate contact during manufacturing of the HEMT structure. The e-mode GaN HEMT devices are switching very fast but improper current sharing between the e-mode GaN HEMT devices may cause the devices to burn. Slowing down the e-mode GaN HEMT devices defeats the purpose of using GaN compared to silicon and silicon carbide MOSFETs.

An alternative to using parallel GaN devices in the first place is a larger GaN device that may be used. However, the distribution of the input current of such devices becomes sensitive to using as much contact area as possible of the device for the source contact.

Consequently, there is a need for a solution that overcomes these drawbacks with existing devices.

U.S. Patent Application No. 2005/189566 A1 discloses a switching power-supply module comprising two circuit boards, driving circuits sections and the diodes performing rectifying operation.

SUMMARY OF THE INVENTION

It is an object of the present invention to provide an improved solution that alleviates the mentioned drawbacks with present devices. Furthermore, it is an object to provide a reliable power converter devices suitable for high power electronics that enable high switching frequency.

The invention is defined by the appended independent claims, with embodiments being set forth in the appended dependent claims, in the following description and in the drawings.

According to a first aspect of the invention, there is provided a power converter device, comprising; a first circuit board, the first circuit board comprising a first driver and at least four GaN HEMT devices arranged in pairs, wherein each pair being a half bridge of GaN HEMT devices, said pairs connected in parallel; a second circuit board, the second circuit board comprising a second driver, and at least four MOSFET devices arranged in pairs, wherein each pair being a half bridge of MOSFET devices, said pairs connected in parallel; wherein the power converter device comprises at least two inter board electrical connections between the first circuit board and the second circuit board wherein source terminal outputs of the pairs of GaN HEMT devices on the first circuit board are via the at least two inter board electrical connections electrically connected to source terminal outputs of the pairs of MOSFET devices on the second circuit board, and wherein drain terminal outputs of the pairs of GaN HEMT devices on the first circuit board are via the at least two inter board electrical connections electrically connected to drain terminal outputs of the pairs of MOSFET devices on the second circuit board; wherein the first circuit board extends in a first plane and the second circuit board extends in a second plane, and the first and second circuit boards are arranged one above the other such that the two planes extends in parallel and the inter board electrical connections between the two circuit boards extends in a direction substantially perpendicular to said first and second planes; and wherein said at least four GaN HEMT devices are electrically connected equidistant to said first driver.

The inventor has realized that it is advantageous to use a plurality of GaN devices to achieve a higher power conversion where several GaN devices behaves as a single device. Further, by providing a symmetrically built power converter device with the two circuit boards vertically arranged above each other and with equidistant connections between the GaN HEMT devices and the first driver, the reliability is improved in avoiding failure due to differences in operation between the GaN HEMT devices at high operation frequencies.

Further, there may be an advantage in the present invention that the GaN HEMT devices share an equal distance to the driver in that delays and variances in the current sharing between the GaN HEMT devices are avoided, in combination with the inter board electrical connections to the circuit board of the MOSFET devices, providing the two circuit boards behaving as a single power converter device.

The two GaN HEMT devices of a pair may be arranged as a half-bridge of GaN HEMT devices. The power converter device may be coupled to a power source, such as an AC power source. The first circuit board may be coupled to the line voltage output of the power source. The second circuit board may be coupled to the neutral line output of the power source.

The first and second circuit boards may be individual printed circuit boards.

By equidistant electrical connections between the GaN HEMT devices and the first driver it may be meant that the distance from a terminal of each GaN HEMT to a respective connection point on the first driver may be equal. By equal it may be meant within a tolerance of ±1%.

The first circuit board may extend in a first plane defined in a first X-Y plane. The second circuit board may extend in a second plane defined in a second X-Y plane. The first and second planes are arranged in parallel. Further, the two planes may be separated in a Z-direction. The Z-direction may be common for the first and second X-Y planes. The at least two inter board electrical connections between the two circuit boards may extend in said Z-direction to electrically connect the two circuit boards.

A long distance connection of the MOSFETs on the neutral line to the GaN HEMT devices on the line voltage may interfere with driving the GaN HEMT devices at their top switching speeds. This may be alleviated with the power converter device according to the present invention.

In one embodiment the inter board electrical connections between the two circuit boards may be provided as mechanical supports between the circuit boards. The mechanical supports may extend substantially perpendicular to the planes in which the circuit boards extend, respectively. The mechanical supports may function as both supports for one of the circuit boards being arranged above the other circuit board, and as electrical connection between the two circuit boards. The mechanical supports may be arranged at an edge portion of the respective circuit board. The mechanical supports may be symmetrically arranged along the circumference of the circuit boards. The two circuit boards may be substantially equal in size. The lengths of the mechanical supports may set the distance between the two circuit boards. The length of the mechanical supports may be selected as short as possible, depending on the physical limitations as how close to each other the two circuit boards may be arranged. The mechanical supports may on each of the two circuit boards be arranged at a point where an electrical connection to the pair of GaN HEMT or MOSFET devices is located, thereby providing electrical connection through the mechanical support. In one embodiment there may be 2, 4, 6, 8, 10, 12, 14, 16, 18 or 20 mechanical supports arranged between the two circuit boards. Preferably there may be provided an even number of mechanical supports, symmetrically distributed along the circumferences of the circuit boards. In one embodiment, besides the at least two mechanical supports providing electrical connection between the two circuit boards, there may be one, two or more mechanical supports that do not provide electrical connection between the two supports, but only function as physical support between the two circuit boards. Of all provided mechanical supports, at least two, such as two, four or eight, of the mechanical supports may provide the electrical connection between the circuit boards. All mechanical supports may together be symmetrically distributed along the circumferences of the circuit boards.

In one embodiment, the inter board electrical connections between the two circuit boards may be provided by screw connections. Such screw connections may for instance be mechanical connections as described above, which are attached by means of screws to the circuit boards.

In one embodiment, the at least two inter board electrical connections between the two circuit boards may provide equidistant electrical connections between the pairs of GaN HEMT devices and the pairs of MOSFET devices. To further improve the symmetry and performance of the power converter device, the inter board electrical connections between the two circuit boards may be provided as electrical connections from the two pairs of GaN HEMT devices to the two pairs of MOSFET devices such that the lengths of the connections are equal for each pair of GaN HEMT and MOSFET devices. Hence the connection distance from the first pair of GaN HEMT devices to the first pair of MOSFET devices may be equal to the connection distance from the second pair of GaN HEMT devices to the second pair of MOSFET devices. The same may apply for the first pair of GaN HEMT devices to the second pair of MOSFET devices and the second pair of GaN HEMT devices to the first pair of MOSFET devices.

In one embodiment, the two GaN HEMT devices in either of the pairs of GaN HEMT devices may be arranged in series. The same may apply to the MOSFET devices of the pairs of MOSFET devices in the second circuit board. The inter board electrical connections between the circuit boards may be provided from each end of the pairs of GaN HEMT devices arranged in series respectively, to each end of the pairs of MOSFET devices arranged in series respectively. In such embodiment, there may be at least four inter board electrical connections between the two circuit boards. In one embodiment, all such four inter board electrical connections may be equidistant from an end of the pair of GaN HEMT devices to an end of the corresponding pair of MOSFET devices.

In one embodiment, the GaN HEMT devices of each pair may be monolithically integrated. An advantage of monolithic integration of a half-bridge of two GaN HEMT devices may be that parasitic inductance and parasitic capacitance may be efficiently reduced. A half-bridge is a common configuration of transistors in power electronics. Hence it may be preferred that two GaN HEMT devices are monolithically integrated as a half-bridge to be applied to a multitude of power electronics applications.

In one embodiment, the first circuit board comprises one or more decoupling capacitor configured for the GaN HEMT devices. The decoupling capacitor may be connected in parallel with the two pairs of GaN HEMT devices. In one embodiment the decoupling capacitor may be arranged symmetrically in parallel with each of the two pairs of GaN HEMT devices. The capacitance of the decoupling capacitors may be 10-50 pF. When the secondary side GaN HEMT devices in the second pair of GaN HEMT devices are switching, they may cause a unstable DC+ voltage which is unfavorable. The decoupling capacitor may stabilize the DC+ voltage, hence enable use of thinner electrical connections and ensuring a proper current sharing between GaN HEMT devices as they are switched by the driver. Thick electrical connections may be impractical and also more costly.

In one embodiment, the first driver may be configured to drive the GaN HEMT devices, wherein the first driver may have a plurality of pins and each GaN HEMT device is in direct electrical connection with one of said plurality of pins. The driver may be a single-channel galvanically isolated gate driver IC such as Infineon 1EDF5673F. In one further embodiment, each GaN HEMT device is arranged directly on one of the plurality of pins. By arranging each GaN HEMT device directly on one of the pins of the first driver, the reliability of the power converter device may be further improved by minimizing the risk of failure due to non-synchronous operation of the GaN HEMT devices.

In one embodiment, the MOSFET devices may be electrically connected equidistant to the second driver. Hence, as described above for the first circuit board, the MOSFET devices of the second circuit board may be arranged with an equal distance to the second driver, for the same reason as for the GaN HEMT devices.

In one embodiment, the power converter device may further comprise an inductor electrically connected between the two GaN HEMT devices of each pair of GaN HEMT devices. The inductor may be configured to supply power directly to the both of the pairs of GaN HEMT devices. The inductor may be arranged between an AC power source and the first circuit board.

In one embodiment, the inductor may be electrically connected equidistant to the pairs of GaN HEMT devices. The inductor may thereby be arranged with an equal connection distance to each of the two pairs of GaN HEMT devices. It may thereby be ensured that the power supplied to the two pairs of GaN HEMT devices are supplied as equal as possible, to prevent any differences in operation of the GaN HEMT devices that may cause failure.

According to a second aspect of the invention, a system is provided comprising two power converter devices according to any of the embodiments above, wherein the two power converter devices are electrically connected in parallel. Further, each of the first and second drivers of the two power converter devices may be configured to be synchronized to the same digital clock. In one embodiment, the system may comprise a digital clock connected to each driver.

In one embodiment, the system may comprise three or six power converter devices according to any of the embodiments above. The power converter devices may be arranged and configured for three phases of a three-phase main supply.

According to a third aspect of the invention, the use of a power converter device or a system according to any of the embodiments above is provided for charging an electrical vehicle. The reliability and functionality of a power converter or system of the present invention may be suitable for the charging of an electrical vehicle. The performance of such charger compared to known chargers may be improved due to a reliable operation of the fast operating GaN HEMT devices.

BRIEF DESCRIPTION OF THE FIGURES

The invention will in the following be described in more detail with reference to the enclosed drawings, wherein.

DESCRIPTION OF EMBODIMENTS

Figure 1:
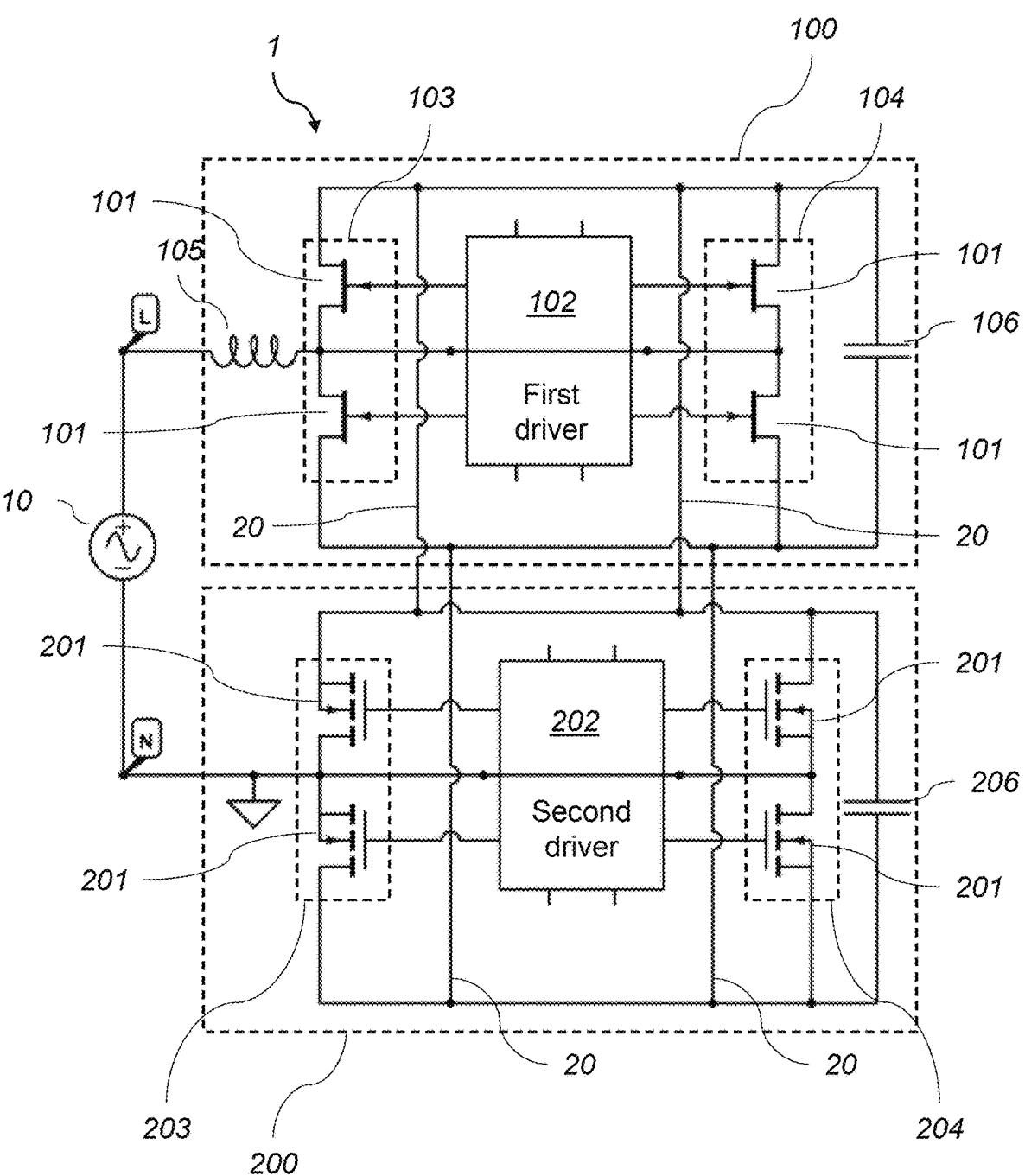
FIG. 1 shows a block diagram of the circuits of a power converter device.

The present invention will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements.

FIG. 1 illustrates a block diagram of a power converter device 1 comprising a first circuit board 100 and a second circuit board 200. The power converter device 1 is connected to an AC power source 10. The first circuit board 100 is connected to the line voltage output L of the power source 10 and the second circuit board 200 is connected to the neutral line output N of the power source 10.

The first circuit board 100 comprises a first driver 102, a first pair 103 of GaN HEMT devices 101 and a second pair 104 of GaN HEMT devices 101. The first pair 103 and the second pair 104 are connected in parallel. Each pair 103, 104 comprises two GaN HEMT devices 101. The two GaN HEMT devices 101 in each pair 103, 104 are connected in series. Each pair 103, 104 of GaN HEMT devices 101 is coupled to the line voltage output L of the power source 10 via an inductor 105. The inductor 105 is connected to the pairs 103, 104 of GaN HEMT devices 101 between the two GaN HEMT devices 101 connected in series.

Each GaN HEMT device 101 is connected to the first driver 102. Each GaN HEMT device 101 is connected with its gate terminal to the first driver 102. The four GaN HEMT devices 101 are connected equidistant to the first driver 102. Within each pair 103, 104 of GaN HEMT devices 101, the source terminal of one of the two GaN HEMT devices is connected to the drain terminal of the other of the two GaN HEMT devices. The output terminals from each pair 103, 104 are thereby one source terminal, one drain terminal and two gate terminals.

The first driver 102 is configured to drive the GaN HEMT devices 101 and the GaN HEMT devices 101 are electrically connected to pins of the first driver 102. In a preferable embodiment, the GaN HEMT devices 101 being connected equidistant to the first driver is provided such that the GaN HEMT devices 101 are arranged directly on the pins of the first driver, or are substantially abutting the pins of the first driver 102. This is advantageous because the equal proximity of the GaN HEMT devices 101 close to the first driver 102 ensures the equal current sharing of the GaN HEMT devices 101.

The second circuit board 200 comprises a second driver 202, a first pair 203 of MOSFET devices 201 and a second pair 204 of MOSFET devices 201. The first pair 203 and the second pair 204 are connected in parallel. Each pair 203, 204 comprises two MOSFET devices 201. The two MOSFET devices 201 in each pair 203, 204 are connected in series. Each pair 203, 204 of MOSFET devices 201 is coupled to the neutral line output N of the power source 10.

Each MOSFET device 201 is connected to the second driver 202. Each MOSFET device 201 is connected with its gate terminal to the second driver 202. The four MOSFET devices 201 are connected equidistant to the second driver 202. Within each pair 203, 204 of MOSFET devices 201, the source terminal of one of the two MOSFET devices is connected to the drain terminal of the other of the two MOSFET devices. The output terminals from each pair 203, 204 are thereby one source terminal, one drain terminal and two gate terminals.

The GaN HEMT devices 101 are arranged in pairs 103, 104 being parallel on the line voltage from the power source 10, and the slow-switching (silicon) MOSFET devices 201 are arranged on the neutral line from the power source 10. It is preferred that the source and drain of the GaN HEMT devices 101 are arranged with alternating DC+ and DC– connections between the first and second circuit boards 100, 200 to electrically connect them to the source and drain of the MOSFET devices 201 on the second circuit board 200.

This is provided by inter board electrical connections 20 between the first and second circuit boards 100, 200. The source terminal outputs of the two pairs 103, 104 of GaN HEMT devices 101 are via the inter board electrical connections 20 between the two circuit boards 100, 200 electrically connected to the source terminal outputs of the two pairs 203, 204 of MOSFET devices 201 on the second circuit board 200. Similarly, the drain terminal outputs of the two pairs 103, 104 of GaN HEMT devices 101 are via the inter board electrical connections 20 between the two circuit boards 100, 200 electrically connected to the drain terminal outputs of the two pairs 203, 204 of MOSFET devices 201 on the second circuit board 200.

In parallel with the two pairs 103, 104 of GaN HEMT devices 101 on the first circuit board 100 a decoupling capacitor 106 is arranged. In parallel with the two pairs 203, 204 of MOSFET devices 101 on the second circuit board 200 a decoupling capacitor 206 is arranged.

Figures 2, 3:
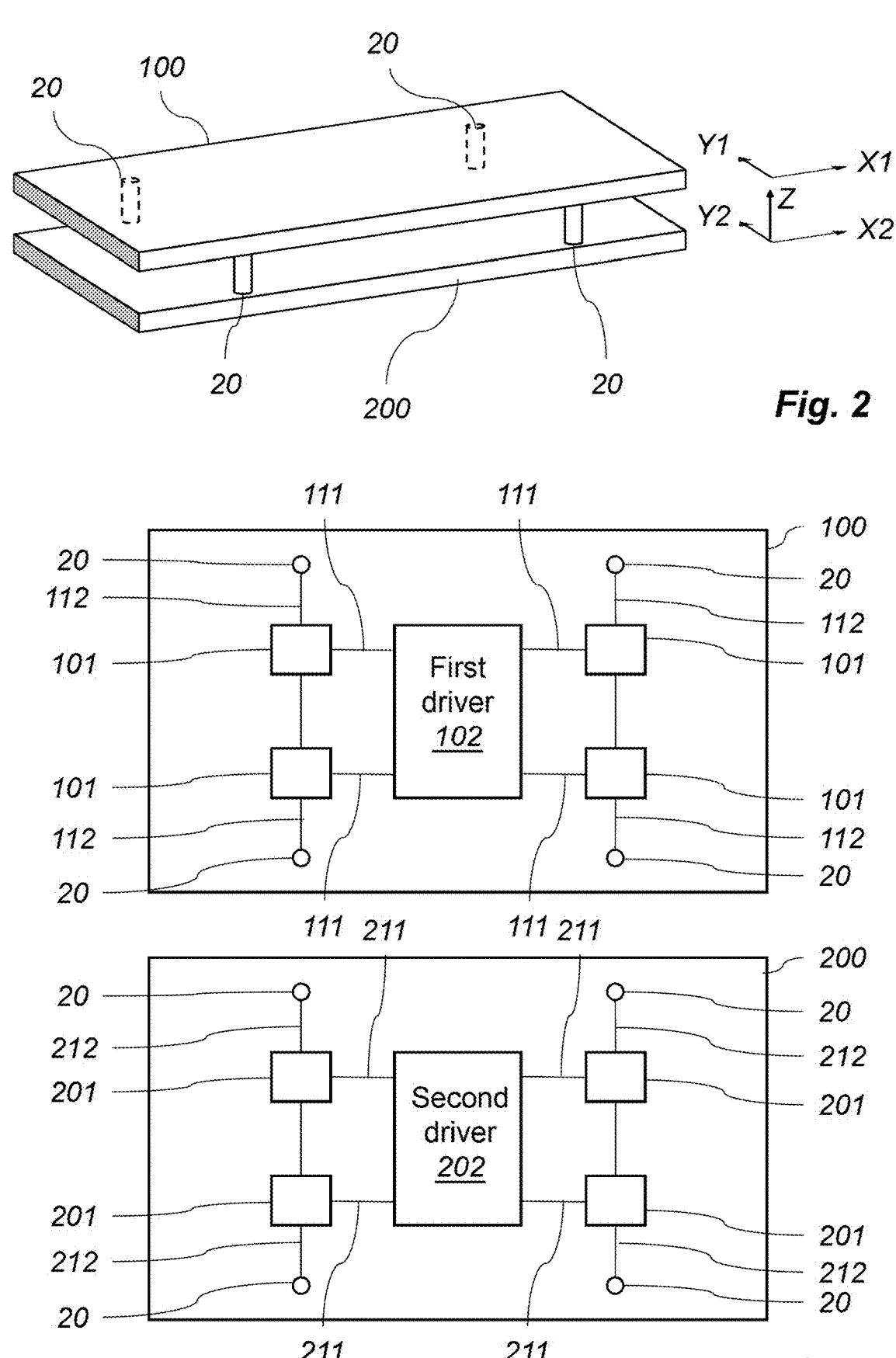
FIG. 2 shows a perspective view of a power converter device.
FIG. 3 shows a schematic top view of the two circuit boards of a power converter device.

FIG. 2 illustrates schematically the first circuit board 100 arranged on top of the second circuit board 200 with four inter board electrical connections 20 provided as also mechanical connections between the two circuit boards 100, 200. The first circuit board 100 extends in a first plane X1-Y1. The second circuit board 200 extends in a second plane X2-Y2. The inter board electrical connections 20 extends, at least partly, in a Z direction between the first plane X1-Y1 and the second plane X2-Y2. The Z direction is perpendicular to the both planes X1-Y1, X2-Y2. With such arrangement, a symmetry may be achieved between the two circuit boards 100, 200 in terms of the electrical connections between components.

FIG. 3 illustrates a layout example of the first and second circuit boards 100, 200 according to an embodiment of the invention. On the first circuit board 100, the GaN HEMT devices 101 are arranged with first intra first board electrical connections 111 between the gate terminal of each GaN HEMT device 101 and a pin of the first driver 102. These four first intra first board electrical connections 111 are equidistant. Hence, they provide an equal distance between the gate terminals of the four GaN HEMT devices 101 and the first driver 102. Further, each GaN HEMT device 101 has a second intra first board electrical connection 112 to the inter board electrical connections 20 between the two circuit boards 100, 200. The second intra first board electrical connection 112 between each GaN HEMT device 101 and the inter board electrical connections 20 are equidistant. Hence, the second intra first board electrical connections 112 provide an equal distance for all GaN HEMT devices 101 to the inter board electrical connection 20 between the circuit boards 100, 200.

On the second circuit board 200, the MOSFET devices 201 are arranged with first intra second board electrical connections 211 between the gate terminal of each MOSFET device 201 and a pin of the second driver 202. These four first intra second board electrical connections 211 are equidistant. Hence, they provide an equal distance between the gate terminals of the four MOSFET devices 101 and the second driver 202. Further, each MOSFET device 201 has a second intra second board electrical connection 212 to the inter board electrical connections 20 between the two circuit boards 100, 200. The second intra second board electrical connection 212 between each MOSFET device 201 and the inter board electrical connections 20 are equidistant. Hence, the second intra second board electrical connections 212 provide an equal distance for all MOSFET devices 201 to the inter board electrical connection 20 between the circuit boards 100, 200.

Figure 4:
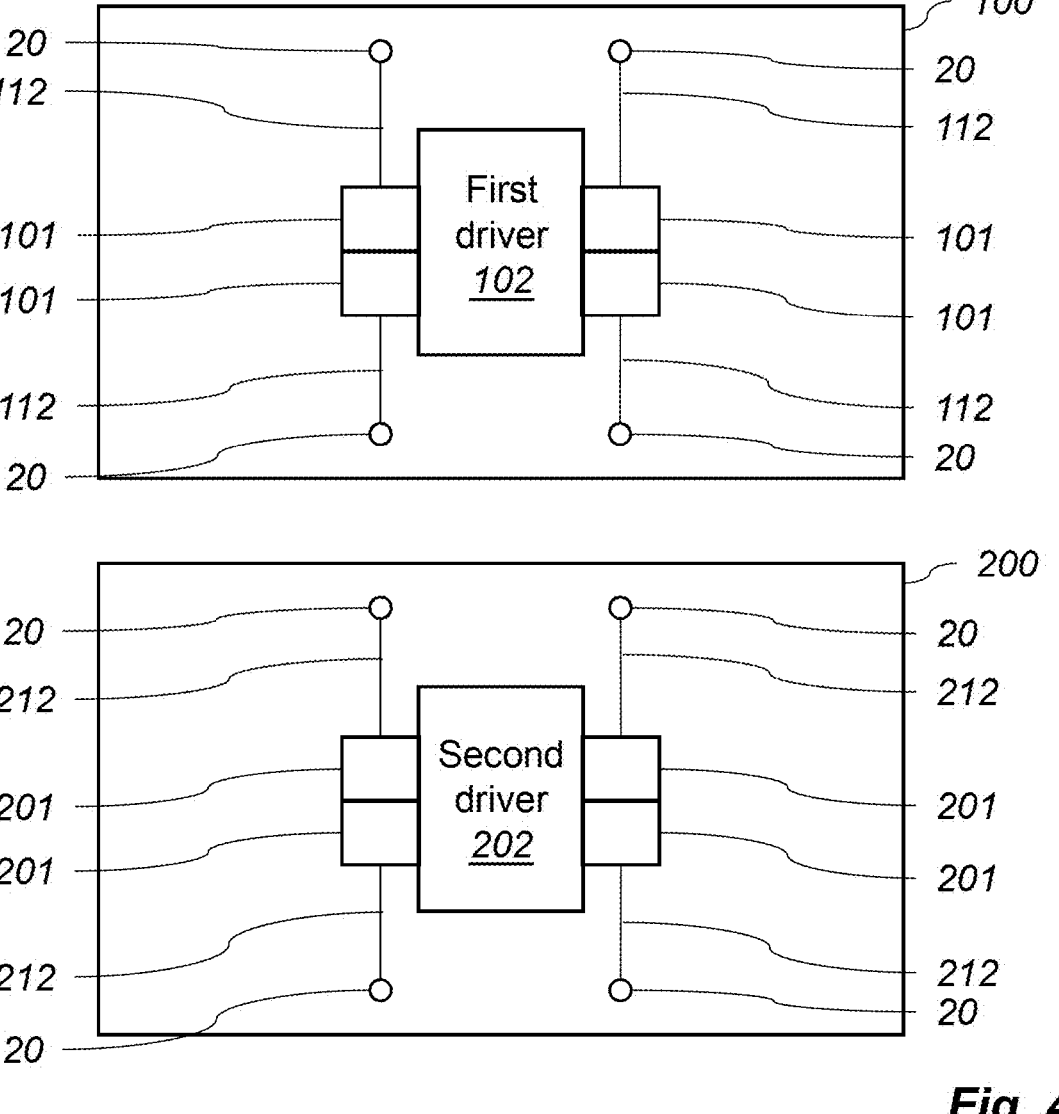
FIG. 4 shows a schematic top view of the two circuit boards of a power converter device.

FIG. 4 illustrates another layout example of the first and second circuit boards 100, 200 according to an embodiment of the invention. In the first circuit board 100, the GaN HEMT devices 101 are arranged directly on the pins of the first driver 102. The first intra first board electrical connections between the GaN HEMT devices 101 and the first driver 102 are thereby effectively made equidistant, and at the same time shortened to further improve the connection stability between the components. Further, the two GaN HEMT devices 101 of each pair 103, 104 are integrally formed. They may be monolithically integrated. The two GaN HEMT devices 101 of a pair 103, 104 are thereby integrally formed with each other directly on respective pins of the first driver 102. The second intra first board electrical connections 112 between each GaN HEMT device 101 and the inter board electrical connections 20 between the circuit boards 100, 200 remains equidistant.

In the second circuit board 200, the MOSFET devices 201 are arranged directly on the pins of the second driver 202. The first intra second board electrical connections between the MOSFET devices 201 and the second driver 202 are thereby effectively made equidistant, and at the same time shortened to further improve the connection stability between the components. Further, the two MOSFET devices 201 of each pair 203, 204 are integrally formed. They may be monolithically integrated. The two MOSFET devices 201 of a pair 203, 204 are thereby integrally formed with each other directly on respective pins of the second driver 202. The second intra second board electrical connections 212 between each MOSFET device 201 and the inter board electrical connections 20 between the circuit boards 100, 200 remains equidistant.

Figure 5:
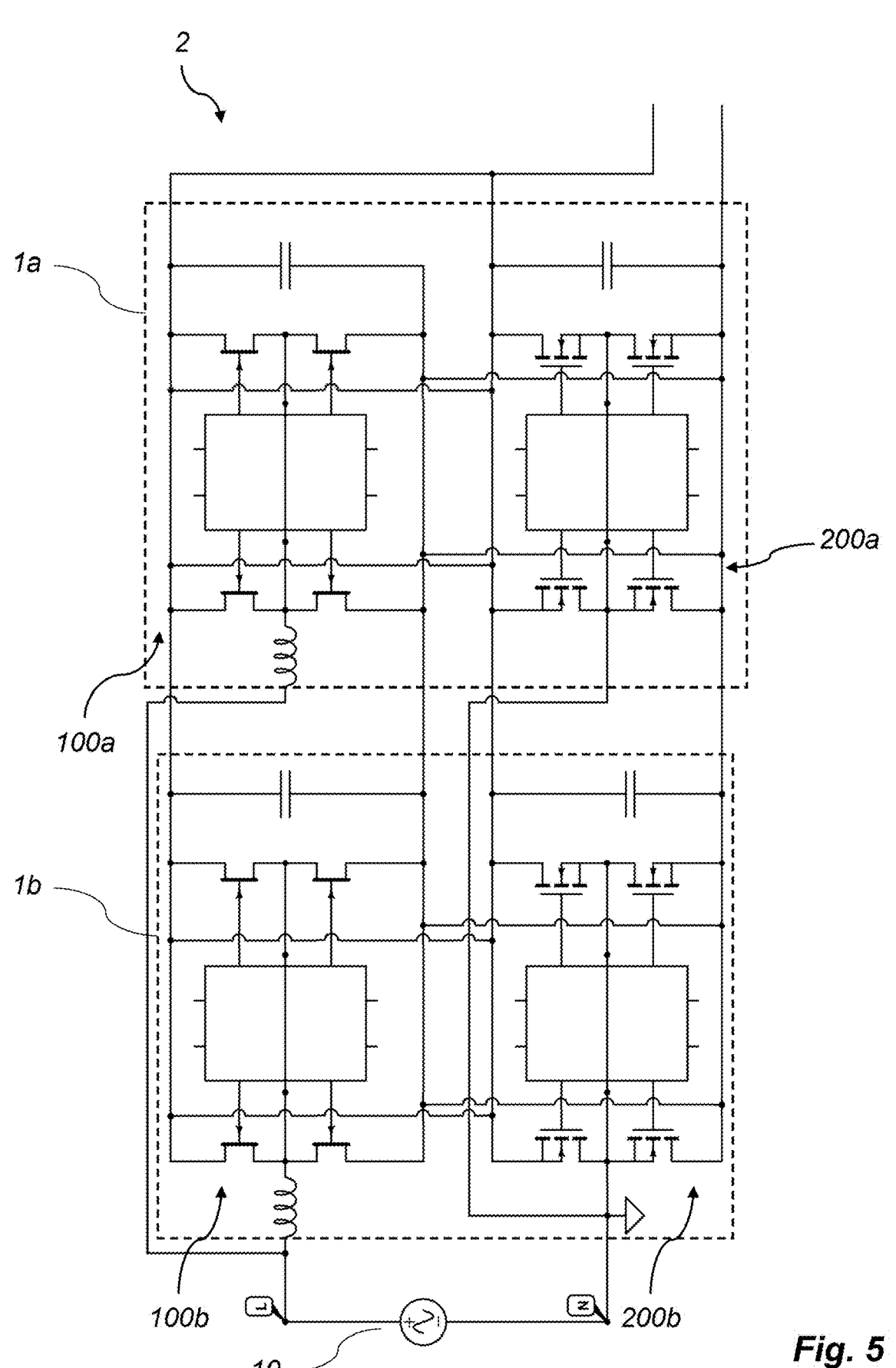
FIG. 5 shows a block diagram of the circuits of a system.

FIG. 5 illustrates a system 2 according to an embodiment of the invention, wherein the system comprises two power converter devices 1a, 1b connected in parallel. The system 2 comprises a power source 10 providing a line voltage output L and a neutral line output N. The line voltage output L is supplied to the first circuit boards 100a, 100b of each of the power converter devices 1a, 1b. The neutral line output N is supplied to the second circuit boards 200a, 200b of each of the power converter devices 1a, 1b.

Each power converter device 1a-b of the system 2 may be arranged with the first circuit board 100a-b with GaN HEMT devices 101 on top or below the second circuit board 200a-b with MOSFET devices 201, and with equidistant electrical connections between each GaN HEMT device 101 and the respective first driver 102.

Figure 6:
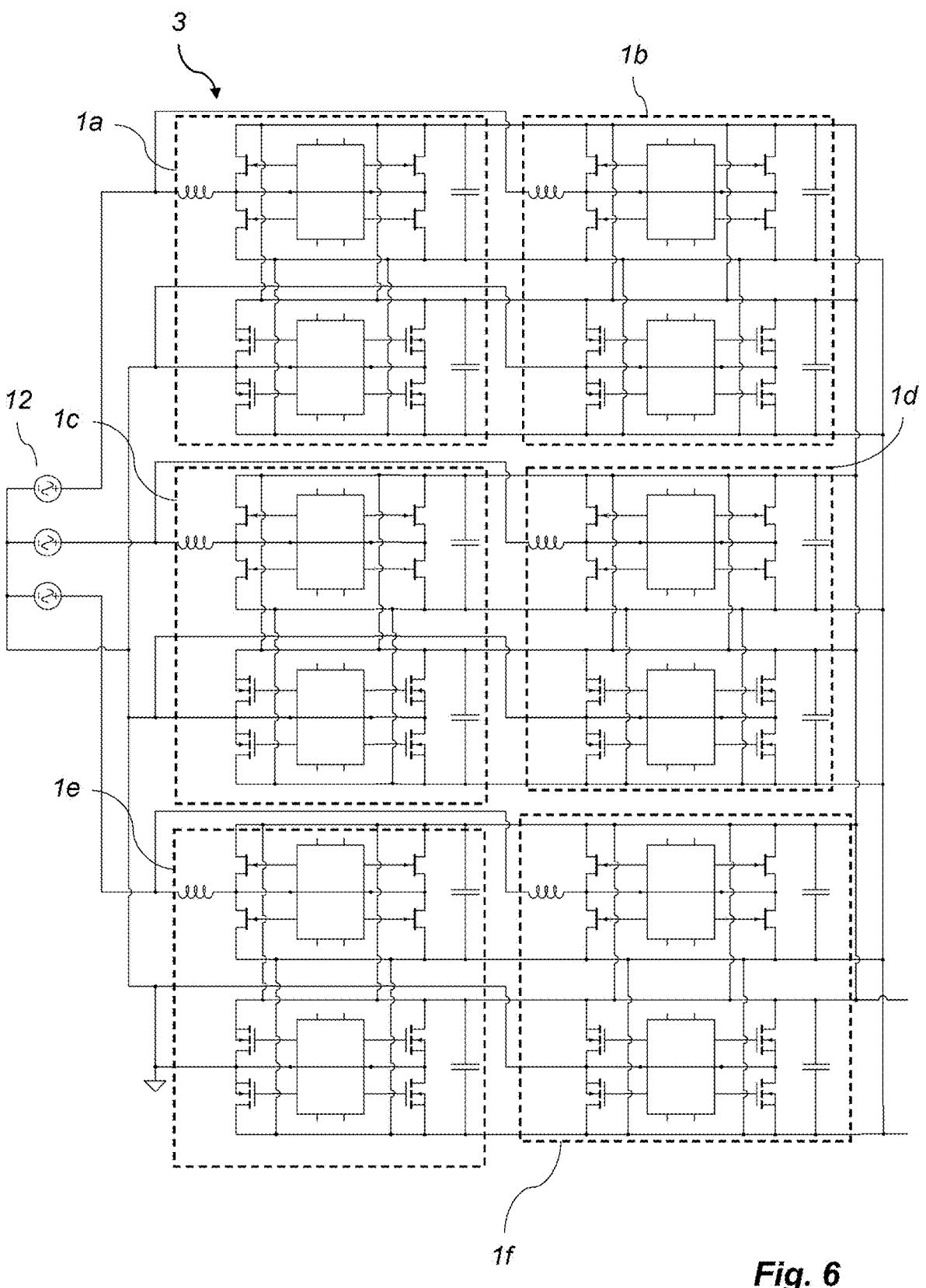
FIG. 6 shows a block diagram of the circuits of a system for three-phase power conversion.

FIG. 6 illustrates a system 3 according to an embodiment of the invention, wherein the system 3 is provided as a three-phase AC-DC converter comprising six power converter devices 1a-f. The system 3 has a power source 12 providing a three-phase AC input. The first phase is supplied to two power converter devices 1a, 1b being arranged in parallel. The second phase is supplied to two power converter devices 1c, 1d being arranged in parallel. The third phase is supplied to two power converter devices 1e, 1f arranged in parallel. The system may be used as the AC-DC converter of a high power fast charger of a charging station or an on-board charger for an electric vehicle.

Each power converter device 1a-f of the system 3 may be arranged with the first circuit board 100 with GaN HEMT devices 101 on top or below the second circuit board 200 with MOSFET devices 201, and with equidistant electrical connections between each GaN HEMT device 101 and the respective first driver 102.

In the drawings and specification, there have been disclosed preferred embodiments and examples of the invention and, although specific terms are employed, they are used in a generic and descriptive sense only and not for the purpose of limitation, the scope of the invention being set forth in the following claims.

The invention claimed is:

1. A power converter device comprising;
a first circuit board comprising:
a first driver; and
at least four GaN HEMT devices arranged in pairs wherein each pair being a half bridge of GaN HEMT devices, said pairs connected in parallel;
a second circuit board comprising:
a second driver; and
at least four MOSFET devices arranged in pairs wherein each pair being a half bridge of MOSFET devices, said pairs connected in parallel;
wherein the power converter device comprises at least two inter board electrical connections between the first circuit board and the second circuit board, wherein source terminal outputs of the pairs of GaN HEMT devices on the first circuit board are via the at least two inter board electrical connections electrically connected to source terminal outputs of the pairs of MOSFET devices on the second circuit board, and wherein drain terminal outputs of the pairs of GaN HEMT devices on the first circuit board are via the at least two inter board electrical connections electrically connected to drain terminal outputs of the pairs of MOSFET devices on the second circuit board;
wherein the first circuit board extends in a first plane and the second circuit board extends in a second plane, and the first and second circuit boards are arranged one above the other such that the two planes extend in parallel and the inter board electrical connections between the two circuit boards extends in a direction substantially perpendicular to said first and second planes; and
wherein said at least four GaN HEMT devices are electrically connected equidistant to said first driver.

2. The power converter device according to claim 1, wherein said inter board electrical connections between the two circuit boards are provided as mechanical supports between the two circuit boards.

3. The power converter device according to claim 1, wherein said inter board electrical connections between the two circuit boards are provided by screw connections.

4. The power converter device according to claim 1, wherein the at least two inter board electrical connections between the two circuit boards provides equidistant electrical connections between the pairs of GaN HEMT devices and the pairs of MOSFET devices.

5. The power converter device according to claim 1, wherein the GaN HEMT devices of each pair are monolithically integrated.

6. The power converter device according to claim 1, wherein said first circuit board comprises a decoupling capacitor configured for said GaN HEMT devices.

7. The power converter device according to claim 6, wherein the decoupling capacitor is symmetrically connected in parallel with each of the pairs of GaN HEMT devices.

8. The power converter device according to claim 1, wherein said first driver is configured to drive said GaN HEMT devices, wherein said first driver having a plurality of pins and each GaN HEMT device is in direct connection with one of said plurality of pins.

9. The power converter device according to claim 8, wherein each GaN HEMT device is arranged directly on one of said plurality of pins.

10. The power converter device according to claim 1, wherein said MOSFET devices are electrically connected equidistant to said second driver.

11. The power converter device according to claim 1, further comprising at least one inductor electrically connected between a common node of the at least four GaN HEMT devices and a power source.

12. The power converter device according to claim 11, wherein the inductor is electrically connected equidistant to the pairs of GaN HEMT devices.

13. A system, comprising two power converter devices according to claim 1, wherein the two power converter devices are electrically connected in parallel, wherein each of the said first and said second drivers are configured to be synchronized to the same digital clock.

14. The system according to claim 13, comprising three or six power converter devices, wherein said power converter devices are configured for three phases of a three-phase main supply.

15. A method of charging an electrical vehicle, wherein the power converter device of claim 1 is used to charge an electrical vehicle.

* * * * *